(12) United States Patent
Kim et al.

(10) Patent No.: US 10,595,407 B2
(45) Date of Patent: *Mar. 17, 2020

(54) PCB LAMINATED STRUCTURE AND MOBILE TERMINAL HAVING THE SAME

(71) Applicant: LG ELECTRONICS INC., Seoul (KR)

(72) Inventors: Jaehyuk Kim, Seoul (KR); Kyungcheol Paek, Seoul (KR); Chaejoo Lim, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/380,441

(22) Filed: Apr. 10, 2019

(65) Prior Publication Data

US 2019/0313529 A1    Oct. 10, 2019

Related U.S. Application Data

(63) Continuation of application No. 16/041,147, filed on Jul. 20, 2018, now Pat. No. 10,342,131, and a
(Continued)

(51) Int. Cl.
*H05K 1/02* (2006.01)
*H05K 1/11* (2006.01)

(52) U.S. Cl.
CPC .......... *H05K 1/115* (2013.01); *H05K 1/0222* (2013.01); *H05K 1/0243* (2013.01)

(58) Field of Classification Search
USPC ....................................................... 174/262
See application file for complete search history.

(56) References Cited

U.S. PATENT DOCUMENTS 8,115,283 B1    2/2012   Bolognia et al.
8,842,443 B2    9/2014   Lim et al.
(Continued)

FOREIGN PATENT DOCUMENTS

JP    2008159984    7/2008
KR    101798918     11/2017

OTHER PUBLICATIONS

European Patent Office Application Serial No. 18202748.2, Search Report dated Apr. 25, 2019, 8 pages.
(Continued)

*Primary Examiner* — Tremesha S Willis
(74) *Attorney, Agent, or Firm* — Lee, Hong, Degerman, Kang & Waimey PC

(57) ABSTRACT

The present disclosure relates to a PCB laminated structure, including a first substrate; a second substrate disposed to overlap with the first substrate on the top and bottom; and an interposer assembly provided between the first substrate and the second substrate to allow electromagnetic connection between the first and second substrates, wherein the interposer assembly includes a housing configured to form a closed region along a top surface circumference of the first substrate and a bottom surface circumference of the second substrate to support the first and second substrates; a signal via connected to the first and second substrates, respectively, to transmit electromagnetic signals between the first substrate and the second substrate; and a ground via connected to the housing to serve as a ground, and spaced a set distance from the signal via at one side of the signal via.

11 Claims, 11 Drawing Sheets

Related U.S. Application Data continuation of application No. PCT/KR2018/005153, filed on May 3, 2018.

(60) Provisional application No. 62/653,552, filed on Apr. 5, 2018.

(56) References Cited

U.S. PATENT DOCUMENTS

| | | |
|---|---|---|
| 2001/0046129 A1 | 11/2001 | Broglia et al. |
| 2002/0076919 A1 | 6/2002 | Peters et al. |
| 2005/0168961 A1 | 8/2005 | Ono et al. |
| 2005/0201065 A1 | 9/2005 | Regnier et al. |
| 2009/0268423 A1 | 10/2009 | Sakurai et al. |
| 2016/0249456 A1 | 8/2016 | Youn et al. |
| 2017/0229775 A1 | 8/2017 | Navarro et al. |
| 2018/0070484 A1 | 3/2018 | Mundell et al. |

OTHER PUBLICATIONS

PCT International Application No. PCT/KR2018/005153, Notification of Transmittal of the International Search Report and the Written Opinion of the International Searching Authority, or Declaration dated Dec. 26, 2018, 10 pages.
United States Patent and Trademark Office U.S. Appl. No. 16/041,147, Office Action dated Sep. 21, 2018, 11 pages.
European Patent Office Application Serial No. 18202748.2, Office Action dated Oct. 24, 2019, 7 pages.

PCB LAMINATED STRUCTURE AND MOBILE TERMINAL HAVING THE SAME

CROSS-REFERENCE TO RELATED APPLICATIONS

This application is a continuation of U.S. patent application No. 16/041,147, filed on Jul. 20, 2018, now U.S. Pat. No. 10,342,131, which claims the benefit of an earlier filing date and priority to U.S. Provisional Application No. 62/653,552, filed Apr. 5, 2018, and is a continuation of International Application No. PCT/KR2018/005153, filed May 3, 2018, the contents of which are all hereby incorporated by reference herein in their entirety.

BACKGROUND OF THE INVENTION

1. Field of the Invention

The present disclosure relates to a PCB laminated structure capable of transmitting signals through an interposer assembly between substrates laminated on the top and bottom, and a mobile terminal including the same.

2. Description of the Conventional Art

A mobile terminal allows implementation in the form of a multimedia player with multiple functions such as capturing still or moving images, playing music or video files, gaming, receiving broadcast, and the like, using various types of electronic components provided inside a terminal body.

A main circuit board on which various electronic devices are mounted is provided inside the mobile terminal. The main circuit board is typically fabricated using a PCB (Printed Circuit Board) substrate. The circuit board typically has a structure in which a conductive layer made of a conductive material and a dielectric layer made of an insulating material are alternately laminated.

As multimedia functions in the mobile terminal are extended, an antenna capable of transmitting and receiving radio signals in various frequency bands is included therein, and the antenna is mounted on a circuit board and connected to a wireless communication unit to transmit and receive frequency signals to perform the role of transmitting and receiving radio signals.

In recent years, a PCB laminated structure having a structure in which a plurality of circuit boards are laminated is formed to implement a communication antenna device in 5G mobile terminals. In order to transmit electronic signals between the laminated circuit boards, an interposer assembly is disposed therebetween. Since a high frequency band is used as communication signals in the 5G mobile terminal, there is a problem in that an interference phenomenon such as parasitic resonance occurs in frequency response characteristics due to communication signals generated by various electronic devices located between the laminated circuit boards to deteriorate communication quality.

SUMMARY OF THE INVENTION

In order to solve the foregoing problems and other problems, an object of the present disclosure is to provide a structure of a PCB laminated structure capable of respectively transmitting digital signals and radio frequency signals by an interposer assembly disposed between the laminated circuit boards.

Another object of the present disclosure is to provide a structure of a PCB laminated structure capable of preventing a signal distortion phenomenon in a frequency band where 5G and high-speed data communication are performed by applying a structure of an interposer assembly in which a signal via and a ground via are disposed.

In order to accomplish the foregoing objectives of the present disclosure, a PCB laminated structure according to the present disclosure may include a first substrate; a second substrate disposed to overlap with the first substrate on the top and bottom; and an interposer assembly provided between the first substrate and the second substrate to allow electromagnetic connection between the first and second substrates, wherein the interposer assembly includes a housing configured to form a closed region along a top surface circumference of the first substrate and a bottom surface circumference of the second substrate to support the first and second substrates; a signal via connected to the first and second substrates, respectively, to transmit electromagnetic signals between the first substrate and the second substrate; and a ground via connected to the housing to serve as a ground, and spaced a set distance from the signal via at one side of the signal via. Through this, the interposer assembly may transmit radio signals together with digital signals, thereby preventing radio signals from being distorted in a high frequency band, and preventing a signal intensity from being reduced in a specific frequency band.

According to an embodiment of the present disclosure, the signal vias and the ground vias may be formed in plural numbers, and the signal vias and the ground vias may be alternately arranged at regular intervals in the closed region.

Here, a distance between the center of a via hole of the signal via and the center of a via hole of the ground via may be preferably configured to have approximately 0.6 mm or less. Through this, a frequency at which a frequency resonance occurs may be shifted, thereby preventing a frequency resonance from occurring in a band used in the 5G band.

According to another embodiment of the present disclosure, a metal coating layer for shielding signals may be formed on a side surface of the housing.

Here, the metal coating layer may be selectively formed along a region adjacent to signal emission devices mounted on the first and second substrates.

Furthermore, a distance between the centers of each ground via spaced apart from each other may be 0.6 mm or less in a region where the metal coating layer is not formed between regions formed with the metal coating layer, thereby minimizing an effect on wireless signals in a high frequency band According to another embodiment of the present disclosure, the ground vias may be disposed on both sides of the signal via, and a plurality of the signal vias may be arranged with the ground via interposed therebetween.

According to another embodiment of the present disclosure, two signal vias may be arranged in parallel with each other with the ground vias interposed therebetween, and formed to have a phase difference of 180 degrees between electromagnetic signals transmitted by the each signal via, thereby minimizing an effect due to surrounding signals.

According to another embodiment of the present disclosure, the signal via may include a signal via hole configured to move signals along the inside; and a signal via pad portion coupled to both upper and lower ends of the signal via hole.

According to another embodiment of the present disclosure, a central portion of the signal via hole may overlap with the center of the signal via pad portion.

According to another embodiment of the present disclosure, ground via pad portions may be coupled to both ends of the ground via, respectively, and the ground via pad portion may be configured to be in contact with the housing.

According to another embodiment of the present disclosure, the housing may include a support portion coupled to an upper surface of the first substrate and a lower surface of the second substrate; and a sidewall portion connecting both sides of the support portion.

According to another embodiment of the present disclosure, there is provided a mobile terminal, including a terminal body; an inner case provided inside the terminal body to support the terminal body, and provided with a display mounted on a front face thereof; a rear case coupled to one side of the inner case to cover a rear portion of the terminal body; a main circuit board provided between the inner case and the rear case; and a PCB laminated structure provided on one side of the main circuit board, wherein the PCB laminated structure includes a first substrate; a second substrate disposed to overlap with the first substrate; and an interposer assembly provided between the first substrate and the second substrate to allow electromagnetic connection between the first and second substrates, and the interposer assembly includes a housing configured to form a closed region along a top surface circumference of the first substrate and a bottom surface circumference of the second substrate to support the first and second substrates; a signal via connected to the first and second substrates, respectively, to transmit electromagnetic signals between the first substrate and the second substrate; and a ground via connected to the housing to serve as a ground, and spaced a set distance from the signal via at one side of the signal via.

The PCB laminated structure having the foregoing structure may efficiently transmit high frequency data signals together with digital signals between the laminated substrates by the signal via included in the interposer assembly.

Furthermore, the ground via may be disposed on one side or both sides of the signal via located inside the interposer assembly, thereby preventing communication signals from being distorted and preventing signals from being reduced in a specific band.

In addition, due to the metal coating layer selectively formed on an inner side and an outer side of the interposer assembly, it may be possible to prevent signals from being distorted due to electronic devices located inside the interposer assembly.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1A:
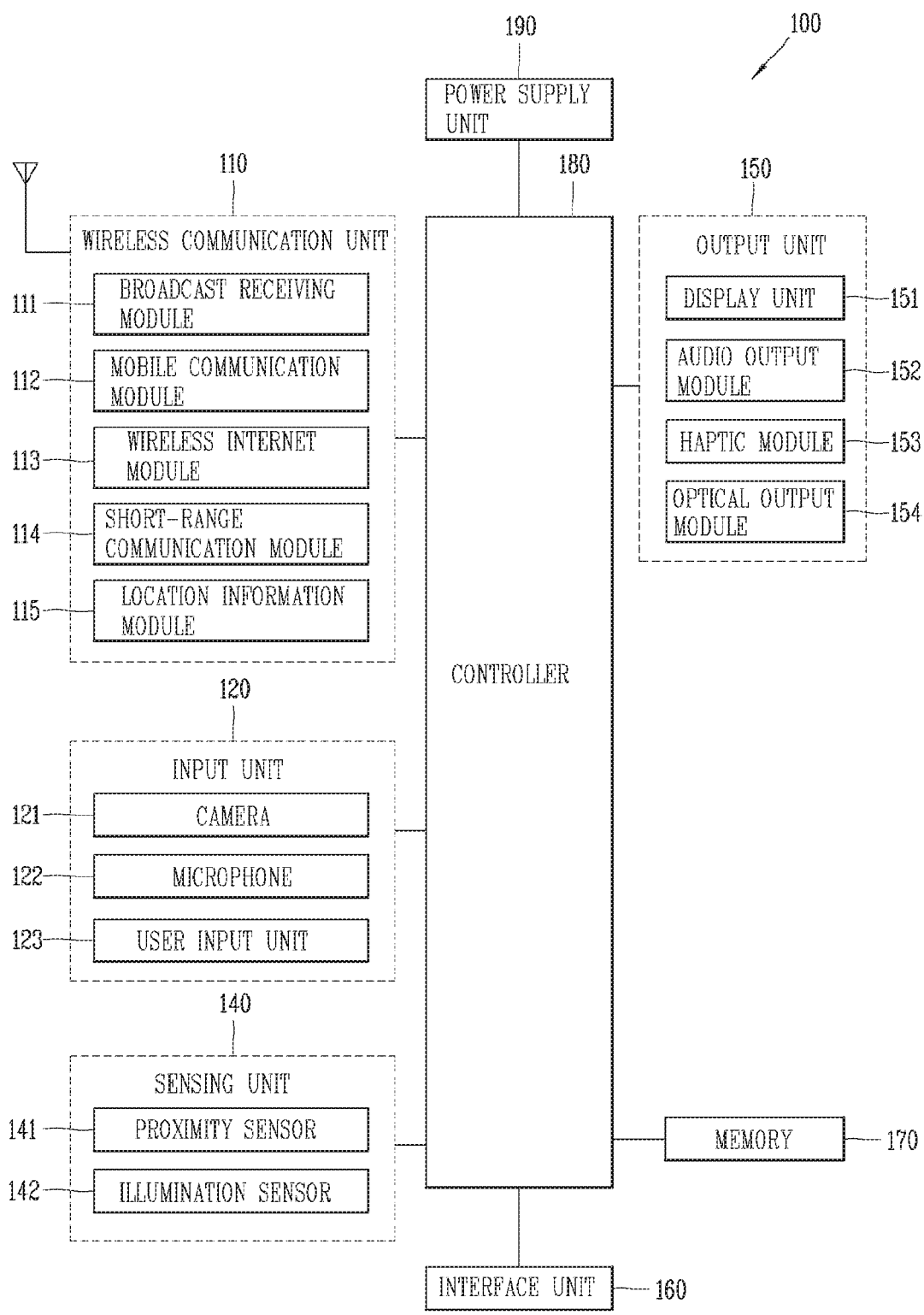
FIG. 1A is a block diagram for explaining a mobile terminal according to the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings.

It will be understood that although the terms first, second, etc. may be used herein to describe various elements, these elements should not be limited by these terms. These terms are generally only used to distinguish one element from another. It will be understood that when an element is referred to as being "connected with" another element, the element can be directly connected with the other element or intervening elements may also be present. On the contrary, in case where an element is "directly connected" or "directly linked" to another element, it should be understood that any other element is not existed therebetween.

A singular representation may include a plural representation as far as it represents a definitely different meaning from the context. Terms 'include' or 'has' used herein should be understood that they are intended to indicate an existence of several components or several steps, disclosed in the specification, and it may also be understood that part of the components or steps may not be included or additional components or steps may further be included.

FIG. 1A is a block diagram for explaining a mobile terminal 100 associated with the present disclosure.

The mobile terminal 100 may include a wireless communication unit 110, an input unit 120, a sensing unit 140, an output unit 150, an interface unit 160, a memory 170, a controller 180, a power supply unit 190, and the like. FIG. 1 illustrates the mobile terminal 100 having various components, but it may be understood that implementing all of the illustrated components is not a requirement. Greater or fewer components may alternatively be implemented.

In more detail, the wireless communication unit 110 of those components may typically include one or more modules allowing wireless communications between the mobile terminal 100 and a wireless communication system, between the mobile terminal 100 and another mobile terminal, or between the mobile terminal 100 and an external server. In addition, the wireless communication unit 110 may include one or more modules for connecting the mobile terminal 100 to one or more networks.

The wireless communication unit 110 may include at least one of a broadcast receiving module 111, a mobile communication module 112, a wireless Internet module 113, a short-range communication module 114, a location information module 115 and the like.

The input unit 120 may include a camera 121 for inputting an image signal, a microphone 122 or an audio input module for inputting an audio signal, or a user input unit 123 (for example, a touch key, a push key (or a mechanical key), etc.) for allowing a user to input information. Audio data or image data collected by the input unit 120 may be analyzed and processed by a user's control command.

The sensing unit 140 is typically implemented using one or more sensors configured to sense internal information of the mobile terminal 100, the surrounding environment of the mobile terminal 100, user information, and the like. For example, the sensing unit 140 may include a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, refer to the camera 121), a microphone 122, a battery gage, an environment sensor (for example, a barometer, a hygrometer, a thermometer, a radiation detection sensor, a thermal sensor, a gas sensor, etc.), and a chemical sensor (for example, an electronic nose, a health care sensor, a biometric sensor, etc.). On the other hand, the mobile terminal disclosed herein may utilize information in such a manner of combining information sensed by at least two sensors of those sensors.

The output unit 150 may be configured to output an audio signal, a video signal or a tactile signal. The output unit 150 may include a display unit 151, an audio output module 152, a haptic module 153, an optical output unit 154 and the like. The display unit 151 may have an inter-layered structure or an integrated structure with a touch sensor in order to facilitate a touch screen. The touch screen may provide an output interface between the mobile terminal 100 and a user, as well as functioning as the user input unit 123 which provides an input interface between the mobile terminal 100 and the user.

The interface unit 160 serves as an interface with various types of external devices that can be coupled to the mobile terminal 100. The interface unit 160, for example, may include wired or wireless headset ports, external power supply ports, wired or wireless data ports, memory card ports, ports for connecting a device having an identification module, audio input/output (I/O) ports, video I/O ports, earphone ports, or the like. The mobile terminal 100 may execute an appropriate control associated with a connected external device, in response to the external device being connected to the interface unit 160.

In addition, the memory 170 stores data that support various functions of the mobile terminal 100. The memory 170 is typically implemented to store data to support various functions or features of the mobile terminal 100. For instance, the memory 170 may be configured to store application programs executed in the mobile terminal 100, data or instructions for operations of the mobile terminal 100, and the like. At least some of those application programs may be downloaded from an external server via wireless communication. Some others of those application programs may be installed within the mobile terminal 100 at the time of being shipped for basic functions of the mobile terminal 100 (for example, receiving a call, placing a call, receiving a message, sending a message, etc.). On the other hand, the application programs may be stored in the memory 170, installed in the mobile terminal 100, and executed by the controller 180 to perform an operation (or a function) of the mobile terminal 100.

The controller 180 may typically control an overall operation of the mobile terminal 100 in addition to the operations associated with the application programs. The controller 180 may provide or process information or functions appropriate for a user by processing signals, data, information and the like, which are input or output by the various components depicted in FIG. 1A, or activating application programs stored in the memory 170.

Furthermore, the controller 180 may control at least part of the components illustrated in FIG. 1A, in order to drive the application programs stored in the memory 170. In addition, the controller 180 may drive the application programs by combining at least two of the components included in the mobile terminal 100 for operation.

The power supply unit 190 may receive external power or internal power and supply appropriate power required for operating respective elements and components included in the mobile terminal 100 under the control of the controller 180. The power supply unit 190 may include a battery, and the battery may be an embedded battery or a replaceable battery.

At least part of those elements and components may be combined to implement the operation and control of the mobile terminal 100 or a control method of the mobile terminal according to various exemplary embodiments described herein. Furthermore, the operation and control or the control method of the mobile terminal 100 may be implemented in the mobile terminal in such a manner of activating at least one application program stored in the memory 170.

Hereinafter, each aforementioned component will be described in more detail with reference to FIG. 1, prior to explaining various exemplary embodiments implemented by the mobile terminal 100 having the configuration.

First, the wireless communication unit 110 will be described. The broadcast receiving module 111 of the wireless communication unit 110 may receive a broadcast signal and/or broadcast associated information from an external broadcast managing entity via a broadcast channel. The broadcast channel may include a satellite channel and/or a terrestrial channel. At least two broadcast receiving modules 111 may be provided in the portable mobile terminal 100 to simultaneously receive at least two broadcast channels or switch the broadcast channels.

The mobile communication module 112 may transmit/receive wireless signals to/from at least one of network entities, for example, a base station, an external terminal, a server, and the like, on a mobile communication network, which is constructed according to technical standards or transmission methods for mobile communications (for example, Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTE-A), etc.)

Here, the radio signal may include a voice signal, a video call signal and/or various types of data according to text and/or multimedia message transmission and/or reception.

The wireless Internet module 113 refers to a module for supporting wireless Internet access, and may be built-in or externally installed on the mobile terminal 100. The wireless Internet module 113 may transmit and/or receive wireless signals via communication networks according to wireless Internet technologies.

Examples of such wireless Internet access may include Wireless LAN (WLAN), Wireless-Fidelity (Wi-Fi), Wireless Fidelity Direct (Wi-Fi Direct), Digital Living Network Alliance (DLNA), Wireless Broadband (WiBro), World Interoperability for Microwave Access (WiMAX), High Speed Downlink Packet Access (HSDPA), High Speed Uplink Packet Access (HSUPA), LTE (Long Term Evolution), LTE-A (Long Term Evolution-Advanced), and the like. The wireless Internet module 113 may transmit/receive data according to at least one wireless Internet technology within a range including even Internet technologies which are not aforementioned.

From the perspective that the wireless Internet accesses according to Wibro, HSDPA, GSM, CDMA, WCDMA, LTE, LTE-A and the like are executed via a mobile communication network, the wireless Internet module 113 which performs the wireless Internet access via the mobile communication network may be understood as a type of the mobile communication module 112.

The short-range communication module 114 denotes a module for short-range communications. Suitable technologies for implementing the short-range communications may include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, and the like. The short-range communication module 114 may support wireless communications between the mobile terminal 100 and a wireless communication system, between the mobile terminal 100 and another mobile terminal, or between the mobile terminal 100 and a network where another mobile terminal (or an external server) is located, via a wireless personal area network. The short-range communication module 114 denotes a module for short-range communications.

Here, the another mobile terminal may be a wearable device, for example, a smart watch, smart glasses or a head mounted display (HMD), which is able to exchange data with the mobile terminal 100 (or to link data with the mobile terminal 100). The short-range communication module 114 may sense (recognize) a wearable device, which is able to communicate with the mobile terminal 100), near the mobile terminal 100. In addition, when the sensed wearable device is a device which is authenticated to communicate with the mobile terminal 100 according to the present disclosure, the controller 180 may transmit at least part of data processed in the mobile terminal 100 to the wearable device via the short-range communication module 114. Hence a user of the wearable device may use the data processed in the mobile terminal 100 on the wearable device. For example, when a call is received in the mobile terminal 100, the user may answer the call using the wearable device. Also, when a message is received in the mobile terminal 100, the user can check the received message using the wearable device.

The location information module 115 is a module for acquiring the location of the mobile terminal 100, and as a representative example, there are a Global Position System (GPS) module or a WiFi (Wireless Fidelity) module. For example, when the mobile terminal 100 uses the GPS module, a position of the mobile terminal 100 may be acquired using a signal sent from a GPS satellite. As another example, when the mobile terminal 100 uses the Wi-Fi module, a position of the mobile terminal 100 may be acquired based on information related to a wireless access point (AP) which transmits or receives a wireless signal to or from the Wi-Fi module. According to the need, the location information module 115 may perform any function of the other modules of the wireless communication unit 110 to obtain data on the location of the mobile terminal 100. As a module used to acquire the location (or current location) of the mobile terminal 100, the location information module 115 may not be necessarily limited to a module for directly calculating or acquiring the location of the mobile terminal 100.

The input unit 120 may be configured to provide an audio or video signal (or information) input to the electronic device or information input by a user to the electronic device. For the input of the audio information, the mobile terminal 100 may include one or a plurality of cameras 121. The camera 121 processes a image frame, such as still picture or video, acquired by an image sensor in a video phone call or image capturing mode. The processed image frames may be displayed on the display unit 151. On the other hand, the plurality of cameras 121 disposed in the mobile terminal 100 may be arranged in a matrix configuration. By use of the cameras 121 having the matrix configuration, a plurality of image information having various angles or focal points may be input into the mobile terminal 100. As another example, the cameras 121 may be located in a stereoscopic arrangement to acquire left and right images for implementing a stereoscopic image.

The microphone 122 may process an external audio signal into electric audio data. The processed audio data may be utilized in various manners according to a function being executed in the mobile terminal 100 (or an application program being executed). On the other hand, the microphone 122 may include assorted noise removing algorithms to remove noise generated in the course of receiving the external audio signal.

The user input unit 123 may receive information input by a user. When information is input through the user input unit 123, the controller 180 may control an operation of the mobile terminal 100 to correspond to the input information. The user input unit 123 may include a mechanical input element (or a mechanical key, for example, a button, a dome switch, a jog wheel, a jog switch or the like located on a front/rear surface or a side surface of the mobile terminal 100), and a touch-sensitive input element. As one example, the touch-sensitive input may be a virtual key or a soft key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

On the other hand, the sensing unit 140 may sense at least one of internal information of the mobile terminal 100, surrounding environment information of the terminal and user information, and generate a sensing signal corresponding to it. The controller 180 may control an operation of the mobile terminal 100 or execute data processing, a function or an operation associated with an application program installed in the mobile terminal 100 based on the sensing signal. Hereinafter, description will be given in more detail of representative sensors of various sensors which may be included in the sensing unit 140.

First, a proximity sensor 141 refers to a sensor to sense presence or absence of an object approaching to a surface to be sensed, or an object disposed near a surface to be sensed, by using an electromagnetic field or infrared rays without a mechanical contact. The proximity sensor 141 may be arranged at an inner region of the mobile terminal 100 covered by the touch screen, or near the touch screen.

The proximity sensor 141, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like. When the touch screen is implemented as a capacitance type, the proximity sensor 141 may sense proximity of a pointer to the touch screen by changes of an electromagnetic field, which is responsive to an approach of an object with conductivity. In this case, the touch screen (touch sensor) may also be categorized as a proximity sensor.

On the other hand, for the sake of brief explanation, a behavior in which the pointer is positioned to be proximate onto the touch screen without contact will be referred to as "proximity touch," whereas a behavior in which the pointer substantially comes into contact with the touch screen will be referred to as "contact touch." For the position corresponding to the proximity touch of the pointer on the touch screen, such position will correspond to a position where the pointer faces perpendicular to the touch screen upon the proximity touch of the pointer. The proximity sensor 141 may sense proximity touch, and proximity touch patterns (e.g., distance, direction, speed, time, position, moving state, etc.). On the other hand, the controller 180 may process data (or information) corresponding to the proximity touches and the proximity touch patterns sensed by the proximity sensor 141, and output visual information corresponding to the process data on the touch screen. In addition, the controller 180 may control the mobile terminal 100 to execute different operations or process different data (or information) according to whether a touch with respect to the same point on the touch screen is either a proximity touch or a contact touch.

A touch sensor can sense a touch applied to the touch screen, such as display unit 151, using any of a variety of touch methods. Examples of such touch methods include a resistive type, a capacitive type, an infrared type, and a magnetic field type, among others.

As one example, the touch sensor may be configured to convert changes of pressure applied to a specific part of the display unit 151 or a capacitance occurring from a specific part of the display unit 151, into electric input signals. Also, the touch sensor may be configured to sense not only a touched position and a touched area, but also touch pressure. Here, the touch object body may be a finger, a touch pen or stylus pen, a pointer, or the like as an object through which a touch is applied to the touch sensor.

When a touch input is sensed by a touch sensor, corresponding signals may be transmitted to a touch controller. The touch controller may process the received signals, and then transmit corresponding data to the controller 180. Accordingly, the controller 180 may sense which region of the display unit 151 has been touched. Here, the touch controller may be a component separate from the controller 180 or the controller 180 itself.

On the other hand, the controller 180 may execute a different control or the same control according to a type of an object which touches the touch screen (or a touch key provided in addition to the touch screen). Whether to execute the different control or the same control according to the object which gives a touch input may be decided based on a current operating state of the mobile terminal 100 or a currently executed application program.

Meanwhile, the touch sensor and the proximity sensor may be executed individually or in combination, to sense various types of touches, such as a short (or tap) touch, a long touch, a multi-touch, a drag touch, a flick touch, a pinch-in touch, a pinch-out touch, a swype touch, a hovering touch, and the like.

An ultrasonic sensor may be configured to recognize position information relating to a sensing object by using ultrasonic waves. On the other hands, the controller 180 may calculate a position of a wave generation source based on information sensed by an illumination sensor and a plurality of ultrasonic sensors. Since light is much faster than ultrasonic waves, a time for which the light reaches the optical sensor may be much shorter than a time for which the ultrasonic wave reaches the ultrasonic sensor. The position of the wave generation source may be calculated using the fact. In more detail, the position of the wave generation source may be calculated by using a time difference from the time that the ultrasonic wave reaches based on the light as a reference signal.

The camera 121 constructing the input unit 120 may be a type of camera sensor. The camera sensor may include at least one of a photo sensor (or image sensor) and a laser sensor.

Implementing the camera 121 with a laser sensor may allow detection of a touch of a physical object with respect to a 3D stereoscopic image. The camera 121 and the laser sensor may be combined to detect a touch of the sensing object with respect to a 3D stereoscopic image. More specifically, the photo sensor is integrated with photo diodes and transistors in the rows and columns thereof, and a content placed on the photo sensor may be scanned by using an electrical signal that is changed according to the amount of light applied to the photo diode. Namely, the photo sensor may calculate the coordinates of the sensing object according to variation of light to thus obtain position information of the sensing object.

The display unit 151 may display (output) information processed in the mobile terminal 100. For example, the display unit 151 may display execution screen information of an application program driven in the mobile terminal 100 or user interface (UI) and graphic user interface (GUI) information in response to the execution screen information.

Furthermore, the display unit 151 may also be implemented as a stereoscopic display unit for displaying stereoscopic images.

The stereoscopic display unit may employ a stereoscopic display scheme such as stereoscopic scheme (a glass scheme), an auto-stereoscopic scheme (glassless scheme), a projection scheme (holographic scheme), or the like.

The audio output module 152 is generally configured to output audio data. Such audio data may be obtained from any of a number of different sources, such that the audio data may be received from the wireless communication unit 110 or may have been stored in the memory 170. Also, the audio output unit 152 may also provide audible output signals related to a particular function (e.g., a call signal reception sound, a message reception sound, etc.) performed by the mobile terminal 100. The audio output module 152 may include a receiver, a speaker, a buzzer or the like.

A haptic module 153 may generate various tactile effects the that user may feel. A typical example of the tactile effect generated by the haptic module 153 may be vibration. Strength, pattern and the like of the vibration generated by the haptic module 153 may be controllable by a user selection or setting of the controller. For example, the haptic module 153 may output different vibrations in a combining manner or a sequential manner.

Besides vibration, the haptic module 153 may generate various other tactile effects, including an effect by stimulation such as a pin arrangement vertically moving with respect to a contact skin, a spray force or suction force of air through a jet orifice or a suction opening, a touch on the skin, a contact of an electrode, electrostatic force, etc., an effect by reproducing the sense of cold and warmth using an element that can absorb or generate heat, and the like.

The haptic module 153 may be configured to transmit tactile effects through a user's direct contact, or a user's muscular sense using a finger or a hand. The haptic module 153 may be implemented in two or more in number according to the configuration of the mobile terminal 100.

An optical output module 154 may output a signal for indicating an event generation using light of a light source. Examples of events generated in the mobile terminal 100 may include a message reception, a call signal reception, a missed call, an alarm, a schedule notice, an email reception, an information reception through an application, and the like.

A signal output by the optical output module 154 may be implemented in such a manner that the electronic device emits monochromatic light or light with a plurality of colors. The signal output may be terminated as the electronic device senses that a user has checked the generated event, for example.

The interface unit 160 serves as an interface for external devices to be connected with the mobile terminal 100. The interface unit 160 may allow a data reception from an external device, a power delivery to each component in the mobile terminal 100, or a data transmission from the mobile terminal 100 to an external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

On the other hand, the identification module may be configured as a chip for storing various information required to authenticate an authority to use the mobile terminal 100, which may include a User Identity Module (UIM), a Subscriber Identity Module (SIM), and the like. In addition, the device having the identification module (also referred to herein as an "identification device") may take the form of a smart card. Accordingly, the identifying device may be connected with the electronic device 100 via the interface unit 160.

The interface unit 160 may serve as a path for power to be supplied from an external cradle to the electronic device 100 when the electronic device 100 is connected to the external cradle or as a path for transferring various command signals inputted from the cradle by a user to the electronic device 100. Such various command signals or power inputted from the cradle may operate as signals for recognizing that the electronic device 100 has accurately been mounted to the cradle.

The memory 170 can store programs to support operations of the controller 180 and store input/output data (for example, phonebook, messages, still images, videos, etc.). The memory 170 may store data associated with various patterns of vibrations and audio which are output in response to touch inputs on the touch screen.

The memory 170 may include at least one type of storage medium including a Flash memory, a hard disk, a multimedia card micro type, a card-type memory (e.g., SD or DX memory, etc.), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, and an optical disk. Also, the electronic device 100 may operate in association with a web storage which performs the storage function of the memory 170 on the Internet.

As aforementioned, the controller 180 may typically control the general operations of the electronic device 100. For example, the controller 180 may set or release a locked state a lock state for restricting a user from inputting a control command with respect to applications when a state of the electronic device 100 meets a preset condition.

Furthermore, the controller 180 may also perform controlling and processing associated with voice calls, data communications, video calls, and the like, or perform pattern recognition processing to recognize a handwriting input or a picture drawing input performed on the touch screen as characters or images, respectively. In addition, the controller 180 may control one or combination of those components in order to implement various exemplary embodiment disclosed herein on the electronic device 100.

The power supply unit 190 may receive external power or internal power and supply appropriate power required for operating respective elements and components under the control of the controller 180. The power supply unit 190 may include a battery, which is typically rechargeable or be detachably coupled to the terminal body for charging.

Furthermore, the power supply unit 190 may include a connection port. The connection port may be configured as one example of the interface unit 160 to which an external (re)charger for supplying power to recharge the battery is electrically connected.

As another example, the power supply unit 190 may be configured to recharge the battery in a wireless manner without use of the connection port. Here, the power supply unit 190 may receive power, transferred from an external wireless power transmitter, using at least one of an inductive coupling method which is based on magnetic induction or a magnetic resonance coupling method which is based on electromagnetic resonance.

Various embodiments described herein may be implemented in a computer-readable or its similar medium using, for example, software, hardware, or any combination thereof.

Hereinafter, a structure of the mobile terminal 100 according to an embodiment of the present disclosure or the terminal in which the above-described components are disposed will be described with reference to FIGS. 1B and 1C.

Figure 1B:
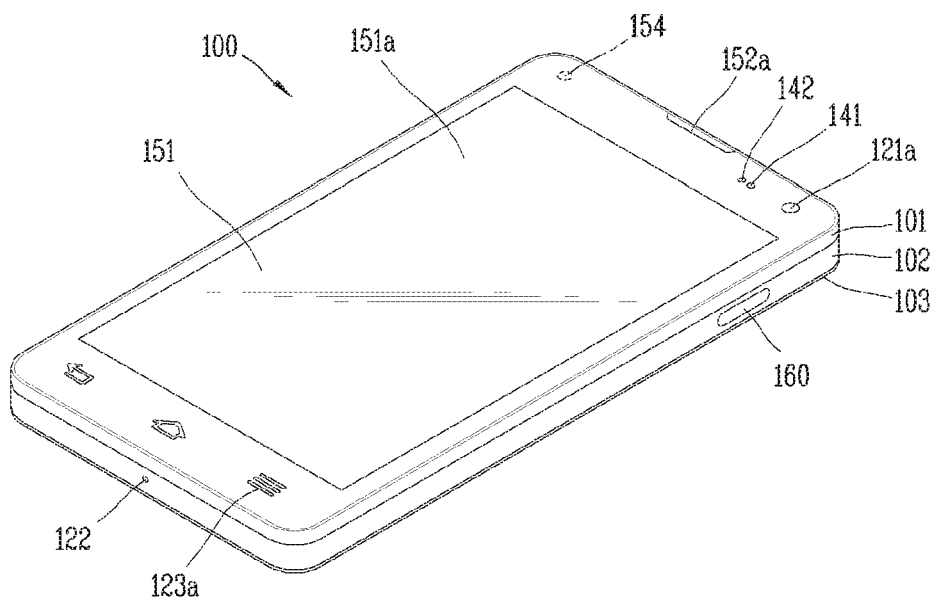
FIG. 1B is a perspective view in which a front portion of the mobile terminal is seen from the outside.
Figure 1C:
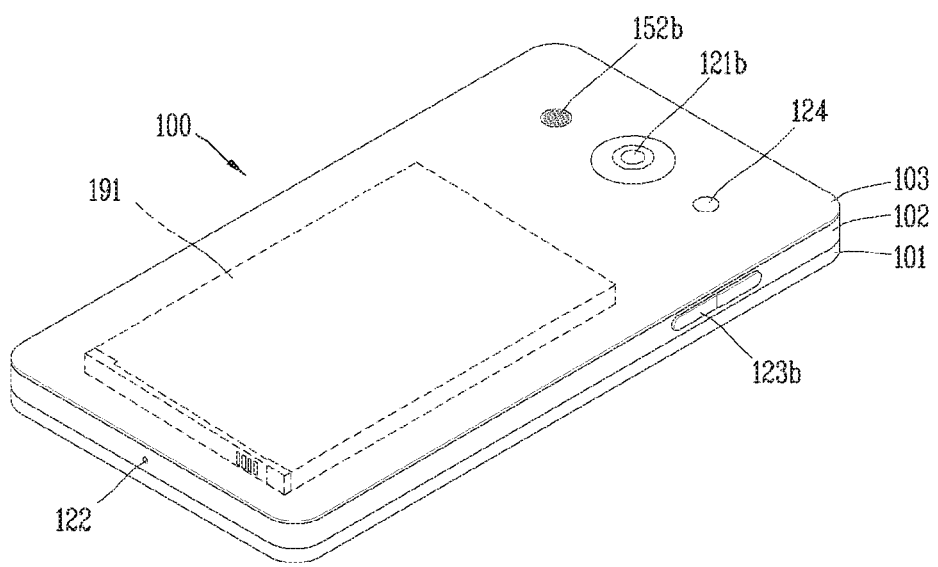
FIG. 1C is a perspective view in which a rear portion of the mobile terminal is seen from the outside.

Referring now to FIGS. 1B and 1C, the mobile terminal 100 disclosed herein is provided with a bar-shaped terminal body. However, the present disclosure may not be necessarily limited to this, and may be also applicable to various structures such as a watch type, a clip type, a glasses type, a folder type in which two or more bodies are coupled to each other in a relatively movable manner, a slide type, a swing type, a swivel type, and the like. The following description in association with a specific type of mobile terminal or on a specific type of mobile terminal will be also typically applied to another type of mobile terminal.

Here, the terminal body may be understood as a conception which indicates the mobile terminal 100 as at least one assembly.

The mobile terminal 100 may include a case (for example, a frame, a housing, a cover, etc.) constituting the appearance thereof. The mobile terminal 100 may include an inner frame 102 and a rear case 103, and various electronic components may be disposed in an inner space formed by a combination of the inner frame 102 and the rear case 103

A display unit 151 may be disposed on a front surface of the terminal body to output information. As illustrated, a window 101 of the display unit 151 may be mounted on the front frame 102 to form a front surface of the terminal body together with the front case 101.

In some cases, electronic components may also be mounted on the rear case 103. Examples of those electronic components mounted on the rear case 103 may include a detachable battery, an identification module, a memory card and the like. When the rear case 103 is detached, the electronic components mounted on the rear case 103 may be exposed to the outside.

As illustrated in the drawing, the rear case 103 may include an opening portion for exposing the camera 121b or the audio output module 152b to the outside.

The cases 101, 102, 103 may be formed by injection-molding synthetic resin or may be formed of a metal, for example, stainless steel (STS), aluminum (Al), titanium (Ti), or the like.

Unlike the example which the plurality of cases form an inner space for accommodating such various components, the mobile terminal 100 may be configured such that one case forms the inner space. In this example, the mobile terminal 100 having a uni-body formed in such a manner that synthetic resin or metal extends from a side surface to a rear surface may also be implemented.

On the other hand, the mobile terminal 100 may include a waterproof portion (not shown) for preventing water from infiltrating into the terminal body. The mobile terminal 100 may include a display unit 151, first and second audio output modules 152a and 152b, a proximity sensor 141, an illumination sensor 152, an optical output module 154, first and second cameras 121a and 121b, first and second manipulation units 123a and 123b, a microphone 122, an interface unit 160 and the like.

Hereinafter, description will be given of an exemplary mobile terminal 100 that the display unit 151, the first audio output module 152a, the proximity sensor 141, the illumination sensor 142, the optical output module 154, the first camera 121a and the first manipulation unit 123a are disposed on the front surface of the terminal body, the second manipulation unit 123b, the microphone 122 and the interface unit 160 are disposed on a side surface of the terminal body, and the second audio output module 152b and the second camera 121b are disposed on a rear surface of the terminal body, with reference to FIGS. 1B and 1C.

However, the foregoing configuration may not be necessarily limited to the arrangement. The foregoing configuration may be excluded, substituted or disposed on another surface if necessary. For example, the first manipulation unit 123a may not be disposed on the front surface of the terminal body, and the second audio output module 152b may be disposed on the side surface other than the rear surface of the terminal body.

The display unit 151 may display (output) information processed in the mobile terminal 100. For example, the display unit 151 may display execution screen information of an application program driven in the mobile terminal 100 or user interface (UI) and graphic user interface (GUI) information in response to the execution screen information.

The display unit 151 may include at least one of a liquid crystal display (LCD), a thin film transistor-liquid crystal display (TFT-LCD), an organic light emitting diode (OLED), a flexible display, a 3-dimensional (3D) display, and an e-ink display.

The display unit 151 may be implemented in two or more in number according to a configured aspect of the mobile terminal 100. In this case, a plurality of the display units 151 may be arranged on one surface to be spaced apart from or integrated with each other, or may be arranged on different surfaces in the mobile terminal 100.

The display unit 151 may include a touch sensor which senses a touch onto the display unit so as to receive a control command in a touching manner. When a touch is input to the display unit 151, the touch sensor may be configured to sense this touch and the controller 180 may generate a control command corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

In this manner, the display unit 151 may form a flexible touch screen along with the touch sensor, and in this case, the touch screen may function as the user input unit 123 (refer to FIG. 1A). Therefore, the touch screen may replace at least some of the functions of the first manipulation unit 123a. Hereinafter, for convenience of explanation, the display unit (display module) for outputting the image and the touch sensor are collectively referred to as a touch screen 151.

The first audio output module 152a may be implemented in the form of a receiver for transferring voice sounds to the user's ear or a loud speaker for outputting various alarm sounds or multimedia reproduction sounds.

The window 151a of the display unit 151 may include a sound hole for emitting sounds generated from the first audio output module 152a. Here, the present disclosure may not be limited to this. It may also be configured such that the sounds are released along an assembly gap between the structural bodies (for example, a gap between the window 151a and the front case 101). In this case, a hole independently formed to output audio sounds may not be seen or hidden in terms of appearance, thereby further simplifying the appearance of the mobile terminal 100.

The optical output module 154 may output light for indicating an event generation. Examples of the event generated in the mobile terminal 100 may include a message reception, a call signal reception, a missed call, an alarm, a schedule notice, an email reception, information reception through an application, and the like. When a user's event check is sensed, the controller 180 may control the optical output unit 154 to end the output of light.

The first camera 121a may process video frames such as still or moving images acquired by the image sensor in a video call mode or a capture mode. The processed video frames may be displayed on the display unit 151 or stored in the memory 170.

The first and second manipulation units 123a and 123b are examples of the user input unit 123, which may be manipulated by a user to input a command for controlling the operation of the mobile terminal 100. The first and second manipulation units 123a and 123b may employ any method if it is a tactile manner allowing the user to perform manipulation with a tactile feeling such as touch, push, scroll or the like. In addition, the first and second manipulation units 123a and 123b may also employ a method of allowing the user to perform manipulation without a tactile feeling through a proximity touch, a hovering touch, or the like.

The drawings are illustrated on the basis that the first manipulation unit 123a is a touch key, but the present disclosure may not be necessarily limited to this. For example, the first manipulation unit 123a may be configured with a mechanical key, or a combination of a touch key and a push key.

The content received by the first and second manipulation units 123a and 123b may be set in various ways. For example, the first manipulation unit 123a may be used by the user to input a command such as menu, home key, cancel, search, or the like, and the second manipulation unit 123b may be used by the user to input a command, such as controlling a volume level being output from the first or second audio output module 152a or 152b, switching into a touch recognition mode of the display unit 151, or the like.

On the other hand, as another example of the user input unit 123, a rear input unit (not shown) may be disposed on the rear surface of the terminal body. The rear input unit may be manipulated by a user to input a command for controlling an operation of the mobile terminal 100. The content input may be set in various ways. For example, the rear input unit may be used by the user to input a command, such as power on/off, start, end, scroll or the like, controlling a volume level being output from the first or second audio output module 152a or 152b, switching into a touch recognition mode of the display unit 151, or the like. The rear input unit may be implemented into a form allowing a touch input, a push input or a combination thereof.

The rear input unit may be disposed to overlap with the display unit 151 of the front surface in a thickness direction of the terminal body. As one example, the rear input unit may be disposed on an upper end portion of the rear surface of the terminal body such that a user can easily manipulate it using a forefinger when the user grabs the terminal body with one hand. However, the present disclosure may not be limited to this, and the position of the rear input unit may be changeable.

When the rear input unit is disposed on the rear surface of the terminal body, a new user interface may be implemented using the rear input unit. Also, the aforementioned touch screen or the rear input unit may substitute for at least part of functions of the first manipulation unit 123a located on the front surface of the terminal body. Accordingly, when the first manipulation unit 123a is not disposed on the front surface of the terminal body, the display unit 151 may be implemented to have a larger screen.

On the other hand, the mobile terminal 100 may include a fingerprint recognition sensor for recognizing a user's fingerprint, and the controller 180 may use fingerprint information sensed through the finger recognition sensor as an authentication means. The finger scan sensor may be installed in the display unit 151 or the user input unit 123. The microphone 122 may be formed to receive the user's voice, other sounds, and the like. The microphone 122 may be provided at a plurality of places, and configured to receive stereo sounds.

The interface unit 160 may serve as a path allowing the mobile terminal 100 to exchange data with external devices. For example, the interface unit 160 may be at least one of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b may be further mounted to the rear surface of the terminal body. The second camera 121b may have an image capturing direction, which is substantially opposite to the direction of the first camera unit 121a.

The second camera 121b may include a plurality of lenses arranged along at least one line. The plurality of lenses may also be arranged in a matrix configuration. The cameras may be referred to as an 'array camera.' When the second camera 121b is implemented as the array camera, images may be captured in various manners using the plurality of lenses and images with better qualities may be obtained.

A flash 124 may be disposed adjacent to the second camera 121b. When an image of a subject is captured with the camera 121b, the flash 124 may illuminate the subject.

The second audio output module 152b may further be disposed on the terminal body. The second audio output module 152b may implement a stereo function in conjunction with the first audio output module 152a, and may be also used to implement a speakerphone mode during a call.

At least one antenna for wireless communication may be disposed on the terminal body. The antenna may be installed in the terminal body or formed on the case. For example, an antenna which configures a part of the broadcast receiving module 111 (see FIG. 1A) may be retractable into the terminal body. Alternatively, an antenna may be formed in a form of film to be attached onto an inner surface of the rear cover 300 or a case including a conductive material may serve as an antenna.

A power supply unit 190 (refer to FIG. 1A) for supplying power to the mobile terminal 100 may be disposed on the terminal body. The power supply unit 190 may include a batter 191 which is mounted in the terminal body or detachably coupled to an outside of the terminal body.

The battery 191 may receive power via a power source cable connected to the interface unit 160. Also, the battery 191 may be (re)chargeable in a wireless manner using a wireless charger. The wireless charging may be implemented by magnetic induction or electromagnetic resonance.

On the other hand, the drawing illustrates that the back cover 103 is coupled to the rear case 102 for shielding the battery 191, so as to prevent separation of the battery 191 and protect the battery 191 from an external impact or foreign materials. When the battery 191 is detachable from the terminal body, the rear case 300 may be detachably coupled to the rear case 102.

An accessory for protecting an appearance or assisting or extending the functions of the mobile terminal 100 can also be provided on the mobile terminal 100. As one example of an accessory, a cover or pouch for covering or accommodating at least one surface of the mobile terminal 100 may be provided. The cover or pouch may link with the display unit 151 to extend the function of the mobile terminal 100. Another example of the accessory may be a touch pen for assisting or extending a touch input onto a touch screen.

Figure 2:
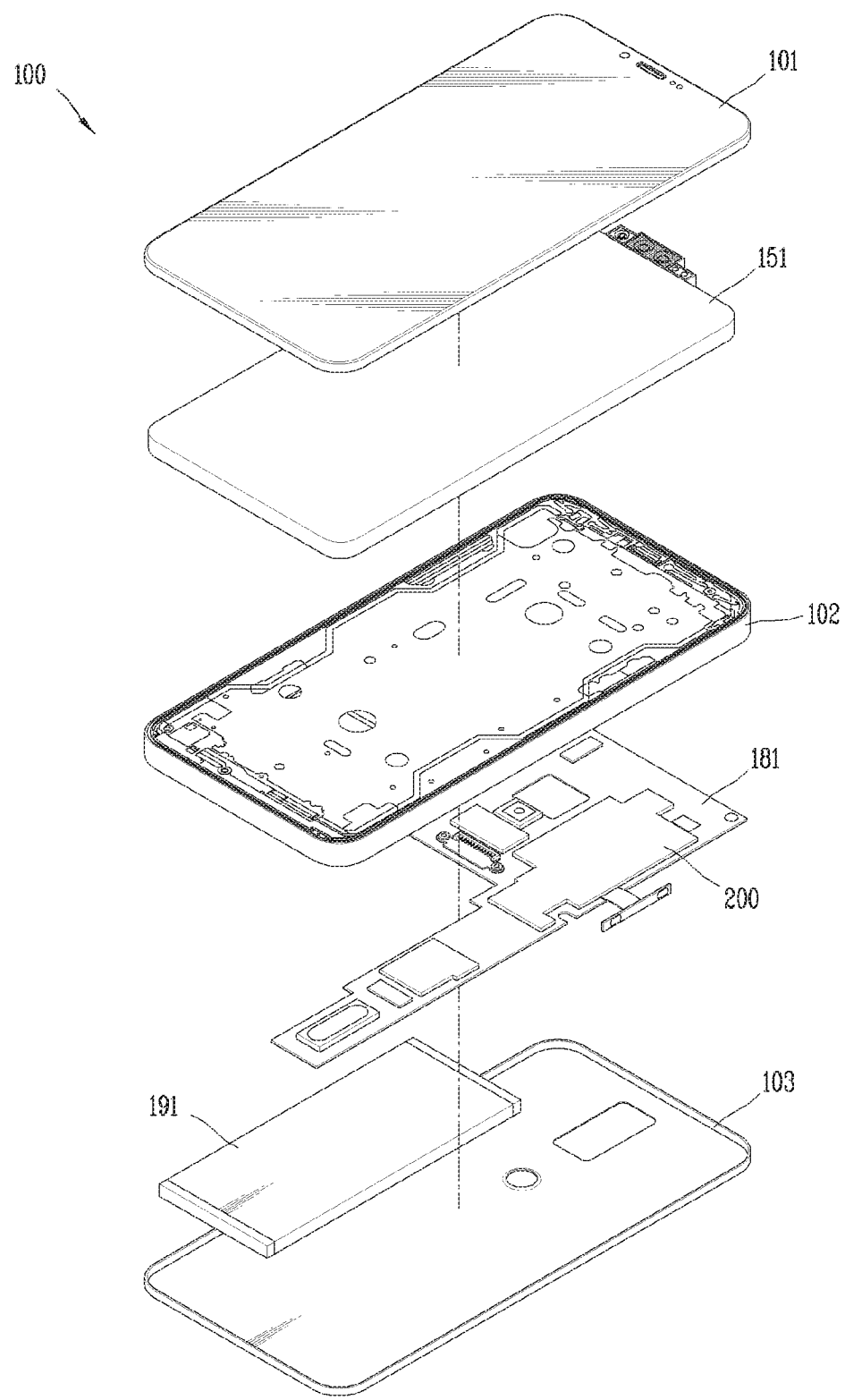
FIG. 2 is an exploded view showing a mobile terminal according to the present invention.

FIG. 2 shows an exploded view in which the mobile terminal 100 according to the present invention is disassembled.

The mobile terminal 100 according to the present disclosure has a structure internally including an inner case 102 in which the display unit 151 is accommodated in a front portion thereof and a rear case 102 provided on a rear surface of the inner case 102. The inner case 102 and the rear case 103 form a predetermined space thereinside. An accommodation space for mounting the battery 190 may be formed on one side of the inner case 102. The rear case 103 may be coupled to the inner case 102 so as to cover the battery 190.

The inner case 102 is configured to form an appearance of a side surface of the mobile terminal 100. Here, the side surface of the mobile terminal 100 denotes a surface connecting the front surface and the rear surface, and a side surface portion thereof may be made of a metal member. When the side member is made of a metal member, it may perform the role of a radiator of the antenna. A side case (not shown) may be separately provided on a side surface of the inner case 102, but the inner case 102 and the side case 104 may also be integrally formed.

Hereinafter, the structure of the mobile device in which the inner case 102 and the side case are integrally formed will be described as an example.

A slit may be formed on a side surface of the inner case 102, and the slit (not shown) may be an ear jack hole or a USB port. When current flows to the side surface of the inner case 102, a portion excluding the side surface of the inner case 102 may be made of a non-metallic member in order to cut off the flow of the current.

As shown in FIG. 2, a main circuit board 181 and a battery 191 may be disposed between the inner case 102 and the rear case 103. The rear case 102 may be formed with a hole 102b through which the battery 191 passes, and a battery accommodation portion 194 may be formed in the front case 101.

The main circuit board 181 is formed in in a substantially '⊏' or 'C' shape, and a plurality of electronic devices (not shown) including a driving chip (not shown) is disposed on the main circuit board 181.

A display 151 including a display panel and a window may be provided on a front surface of the inner case 102. The inner case 101 may operate as a ground (GND), and may be made of a metal material to maintain sufficient rigidity. The main circuit board 181 or the antenna 130 may be connected and grounded to the inner frame 102, and may operate as a ground (GND) of the main circuit board 181 or the antenna 130.

A PCB laminated assembly 200 having a structure laminated with circuit boards may be provided on one side of the main circuit board 181, and the main circuit board 181 may be electrically connected to the PCB laminated assembly 200. Through this, it may be possible to process radio signals (or radio electromagnetic waves) transmitted and received. At this time, a plurality of transceiver circuits may be formed or mounted on the main circuit board 181 for the processing of radio signals.

Figure 3:
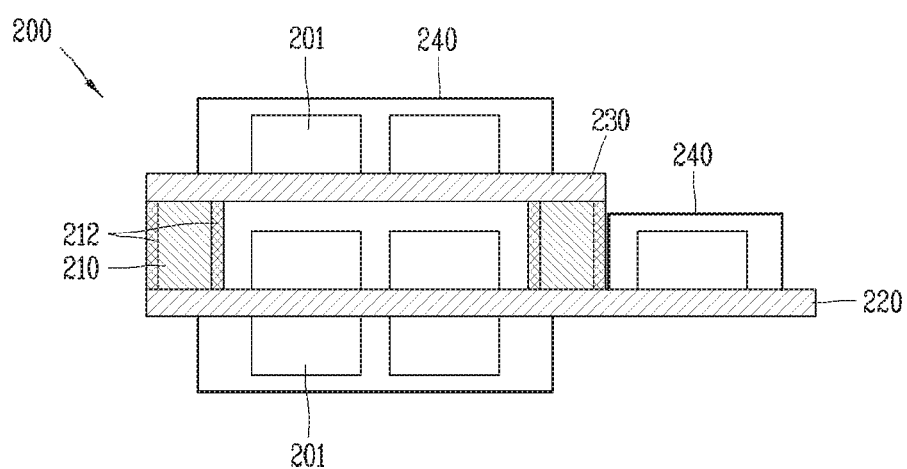
FIG. 3 is a conceptual view showing the shape of a PCB laminated structure according to the present disclosure.

FIG. 3 is a conceptual view showing the shape of a PCB laminated structure 200 according to the present disclosure.

The PCB laminated structure 200 has a structure in which a first substrate 220 and a second substrate 230 are laminated on the top and bottom to perform the role of transmitting and receiving the antenna signals of the terminal. An interposer assembly 210 may be provided between the first substrate 220 and the second substrate 230 to perform signal transmission between the first and second substrates 230 while shielding the signals of an electronic device 201 provided between the first substrate 220 and the second substrate 230.

As shown in FIG. 3, the electronic device 201 may be mounted on either one surface or both surfaces of the first substrate 220, and the electronic device 201 may denote an application processor (AP) for processing and computing data or a power amplifier module (PAM) for converting and supplying power.

Similarly, the electronic device 201 may be disposed on either one surface or both surfaces of the second substrate 230. Here, the electronic device 201 may denote a device for the communication of the terminal, and may denote a high-frequency signal device for RF signal transmission. The second substrate 230 is disposed at an upper portion of the first substrate 220, and thus the first and second substrates 230 has an overlapping structure on the top and bottom. Furthermore, a shield can 240 may be provided on each electronic device 201 to shield electronic signals radiated from each electronic elements 201.

The interposer assembly 210 is provided between the first substrate 220 and the second substrate 230 to allow the first and second substrates 230 to be electrically coupled to each other, thereby shielding electromagnetic waves generated from each electronic device 201. In addition, metal coating layers 212 may be formed on inner and outer surfaces of the interposer assembly 210, respectively.

The interposer assembly 210 may be made of a material that generally constitutes a printed circuit board (PCB). The interposer assembly 210 may be configured to include a housing 211, a sidewall portion 211b, and a signal via 213 and a ground via 214 that are connected to the first and second substrates 230. The PCB laminated structure 200 is configured such that the electronic device 201 for transmitting RF signals is mounted on the second substrate 230 to enable the movement of the RF signals through the interposer assembly 210.

Figure 4A:
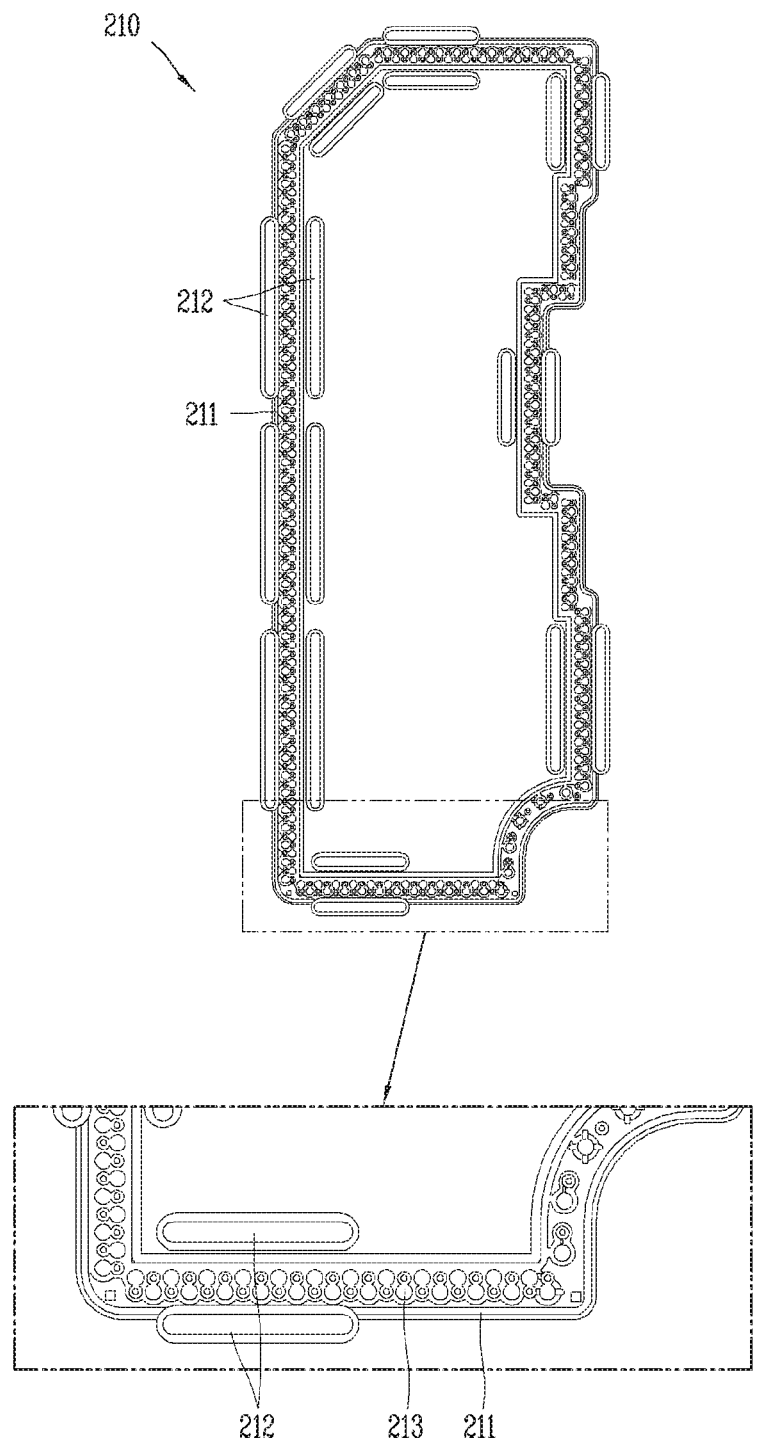
FIG. 4A is a view showing an interposer assembly located between a first substrate and a second substrate in a PCB laminated structure.
Figure 4B:
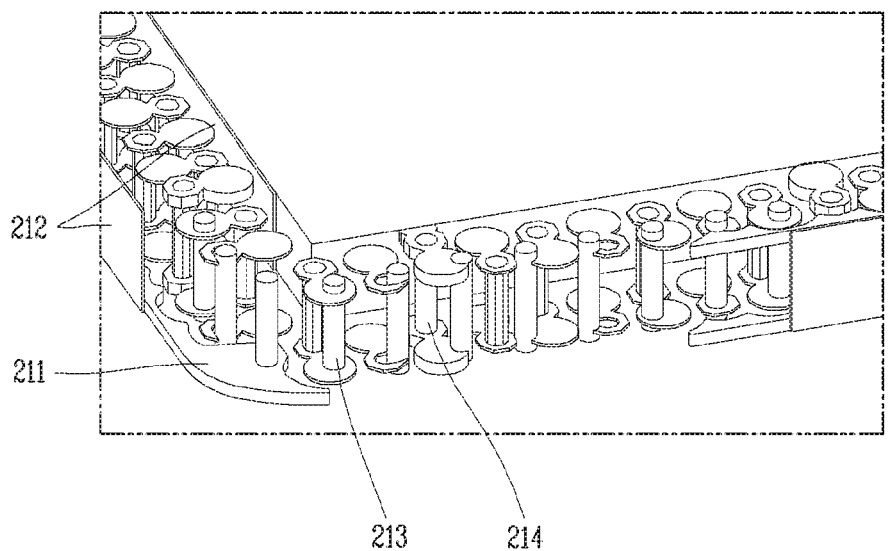
FIG. 4B is an enlarged view showing the shape of the interposer assembly.

FIG. 4A is a view showing the interposer assembly 210 located between the first substrate 220 and the second substrate 230 in the PCB laminated structure 200, and FIG. 4B is an enlarged view showing the shape of the interposer assembly 210.

The interposer assembly 210 may be configured to include a housing 211, a side wall 211b and a signal via 213 and a ground via 214 that are connected to the first and second substrates 230. In addition, metal coating layers 212 may be formed on inner and outer surfaces of the interposer assembly 210, respectively.

Through the interposer assembly 210, the transmission of RF signals together with digital signals is enabled.

The housing 211 is provided along an upper circumferential portion of the first substrate 220 and a circumferential portion of the lower surface of the second substrate 230 to form a closed region between the first substrate 220 and the second substrate 230. The housing 211 is configured to support the first substrate 220 and the second substrate 230, respectively. The housing 211 may serve as a ground, and may be connected to the ground via 214 which will be described which will be described later to perform the role of grounding.

The housing 211 is configured to include a support portion 211*a* constituting upper and lower surfaces thereof and a sidewall portion 211*b* located in a direction intersecting the first and second substrates 230 by coupling both ends of the support portion 211*a*.

The support portion 211*a* is configured to be coupled to an upper surface of the first substrate 220 and a lower surface of the second substrate 230, and has a structure in which the sidewall portion 211*b* is coupled to both ends of the support portion 211*a*. The support portion 211*a* serves to support both ends of the signal via 213 and the ground via 214, and the sidewall portion 211*b* forms an outer surface of the interposer assembly 210.

The interposer assembly 210 may include the signal via 213 connected to the first and second substrates 230 to form electrical signal transmission between the first substrate 220 and the second substrate 230, and the ground via 214 connected to the housing 211 to serve as a ground and disposed to be spaced a set distance from the signal via 213 on one side of the signal via 213.

The signal via 213 is interposed between the first substrate 220 and the second substrate 230 to transmit digital signals and RF signals. The ground via 214 is configured to be connected to the housing 211 as described above to perform the role of grounding, and when located adjacent to the signal via 213, the ground vias 214 minimizes signal interference in signal transmission using the 5G frequency band and in a signal transmission band above 6 GHz.

Here, as shown in FIGS. 4A and 4B, a plurality of signal vias 213 and ground vias 214 may be formed, and the signal vias 213 and the ground vias 214 may be formed to be alternately arranged at regular intervals in a closed region.

When RF signals emitted by the electronic device located in a closed space of the interposer assembly 210 is emitted to the outside through the interposer assembly 210, it may cause interference in communication signals, thereby reducing call sensitivity or generating a noise. As a result, in the PCB laminated structure 200 according to the present disclosure, the metal coating layers 212 may be formed on both sides of the sidewall portion 211*b* to prevent communication signal emission devices mounted on the first substrate 220 and the second substrate 230 from being radiated to the outside.

As shown in FIG. 4A, the metal coating layers 212 may be formed on an outer side surface of an outer sidewall portion 211*b* and an inner side surface of an inner sidewall portion 211*b*, respectively, to surround a closed region formed by the interposer assembly 210. Through this, it may be possible to shield signals inside the interposer assembly 210 and minimize an effect on high frequency data communication.

In addition, the metal coating layers 212 may be selectively formed along a region adjacent to signal emission devices mounted on the first and second substrates 230. As a result, signal emission due to the signal emission devices may be minimized to minimize interference phenomenon according to high frequency data communication.

Figure 5A:
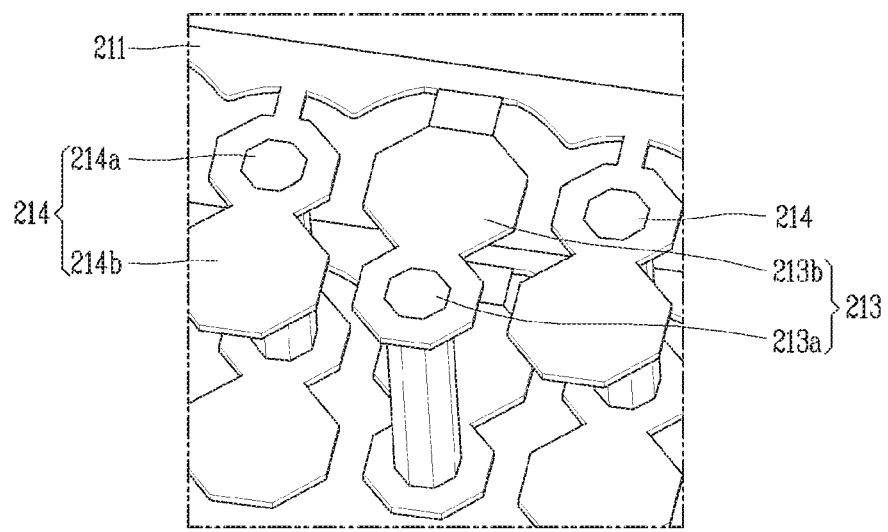
FIG. 5A is a view showing the arrangement of a signal via and a ground via according to an embodiment of the present disclosure.
Figure 5B:
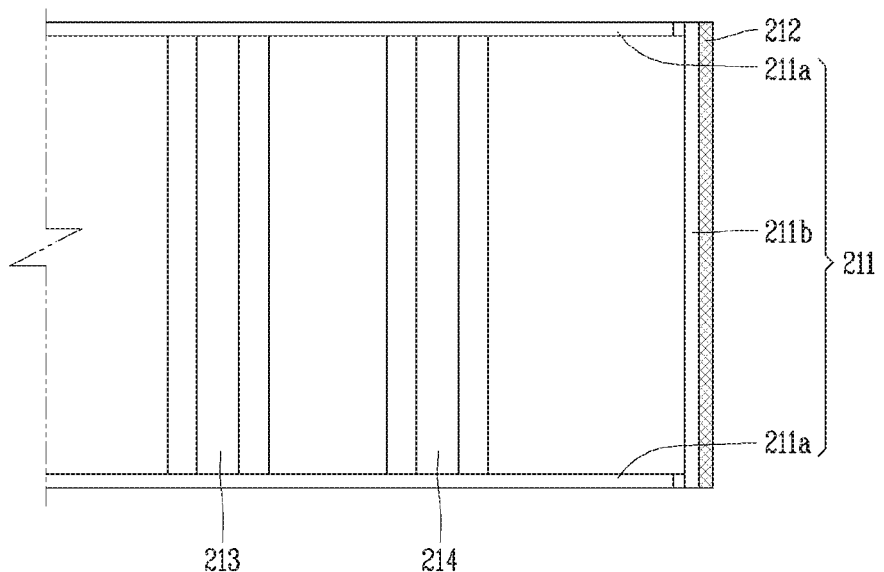
FIG. 5B is a side view in which the arrangement in FIG. 5A is seen from the lateral side.

FIG. 5A is a view showing the arrangement of a signal via 213 and a ground via 214 according to an embodiment of the present disclosure, and FIG. 5B is a side view in which the arrangement in FIG. 5A is seen from the lateral side.

As described above, the interposer assembly 210 included in the PCB laminated structure 200 may be configured to include the signal via 213 and the ground via 214.

The signal via 213 may include a signal via hole 213*a* and a signal via pad portions 213*b* coupled to both end portions of the signal via hole 213*a* to move a signal along an inside thereof. Signal transmission between the first substrate 220 and the second substrate 230 may be performed along the signal via hole 213*a*.

The ground via 214 may be configured to be coupled to the housing 211 to serve as a ground.

The ground via 214 are formed such that the ground via pad portions 214*b* are coupled to both ends of the ground via hole 214. The ground via pad portion 214*b* may be configured to be in contact with the support portion 211*a* of the housing 211.

As shown in FIG. 5A, the signal via 213 and the ground via 214 may be configured to be alternately arranged at regular intervals in a closed region formed by the housing 211. At this time, the ground vias 214 may be disposed on both sides of the signal via 213, respectively. The ground vias 214 located on both sides of the signal via 213 may prevent communication signals in a high frequency band from being distorted by signals emitted from the RF device, and prevent reception sensitivity according to signal reduction from being reduced in a specific band.

Figure 6A:
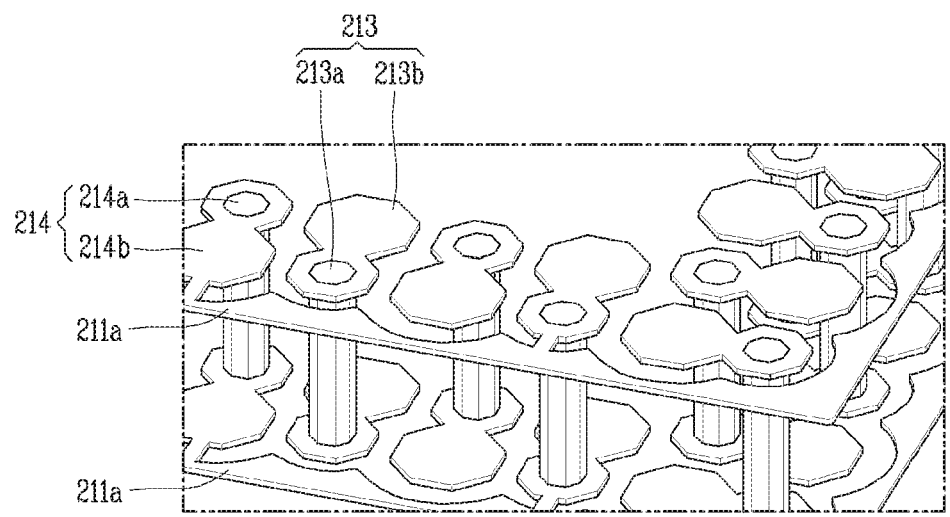
FIG. 6A is a view showing the arrangement relationship of a signal via and a ground via of the PCB laminated structure according to another embodiment of the present disclosure.
Figure 6B:
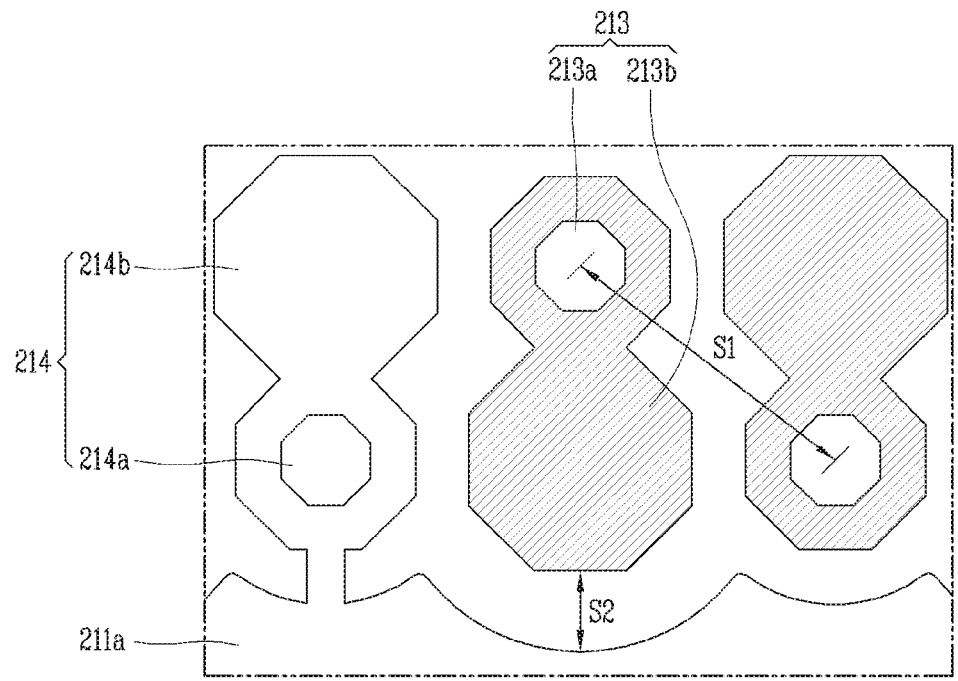
FIG. 6B is an enlarged view of FIG. 6A.
Figure 6C:
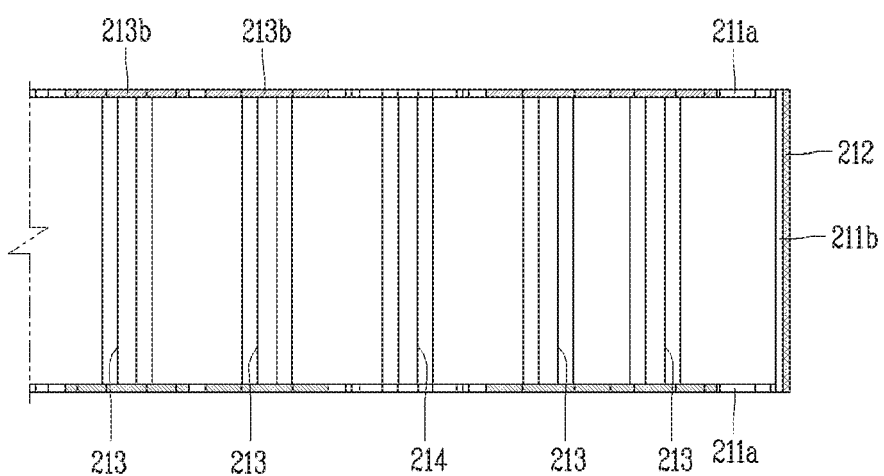
FIG. 6C is a side view in which the arrangement in FIG. 6A is seen from the lateral side.

FIG. 6A is a view showing the arrangement relationship of the signal via 213 and the ground via 214 of the PCB laminated structure 200 according to another embodiment of the present disclosure. FIG. 6B is an enlarged view of FIG. 6A. FIG. 6C is a side view in which the arrangement in FIG. 6A is seen from the lateral side.

The interposer assembly 210 of the PCB laminate structure 200 according to the present disclosure may be configured to include the signal via 213 and the ground via 214, and a plurality of the signal vias 213 may be arranged with the ground via 214 interposed therebetween. Specifically, two signal vias 213 may be arranged on both sides of the ground via 214, respectively.

At this time, the two signal vias 213 may be arranged in parallel with each other with the ground vias 214 interposed therebetween, and may be set to have a phase difference of 180 degrees between electromagnetic signals transmitted by the two different signal vias 213. When electromagnetic signals transmitted between the signal vias have the same phase, interference occurs with each other. Accordingly, in the case of the present disclosure, it may be set to have a phase difference of 180 degrees between electromagnetic signals transmitted between two different signal vias 213 disposed between the ground vias 214, thereby preventing the transmission of electromagnetic signals from being interfered, and reducing the influence of ambient noise during high frequency communication using a high frequency band.

The plurality of signal vias 213 arranged between the ground vias 214 may be preferably configured such that a distance (S1) between the centers of the via hole 213*a* of each signal via 213 is approximately 0.6 mm or less. The signal via pad portion 213*b* of each signal via 213 is preferably configured to be spaced apart from the housing 211 by 17 mm or more. This is an experimentally confirmed value, and through this, it may be possible to prevent the occurrence of resonance according to a frequency response characteristic, thereby minimizing the distortion of the signal.

As shown in FIG. 6C, two signal vias 213 may be arranged on both sides of the ground via 214. A signal via hole 213*a* may be formed in the signal via 213 to move a signal along the inside of the signal via 213, and signal via pad portions 213*b* may be located at both end portions of the signal via hole 213a. Signal transmission between the first substrate 220 and the second substrate 230 may be performed along the signal via hole 213a, and the ground via 214 may be configured to be coupled to the housing 211 to serve as a ground. The ground via 214 are formed such that the ground via pad portions 214b are coupled to both ends of the ground via hole 214. The ground via pad portion 214b may be configured to be in contact with the support portion 211a of the housing 211. Furthermore, the metal coating layer 212 is formed on the sidewall portion 211b of the housing 211 to prevent the RF signal from being distorted.

Figure 7A:
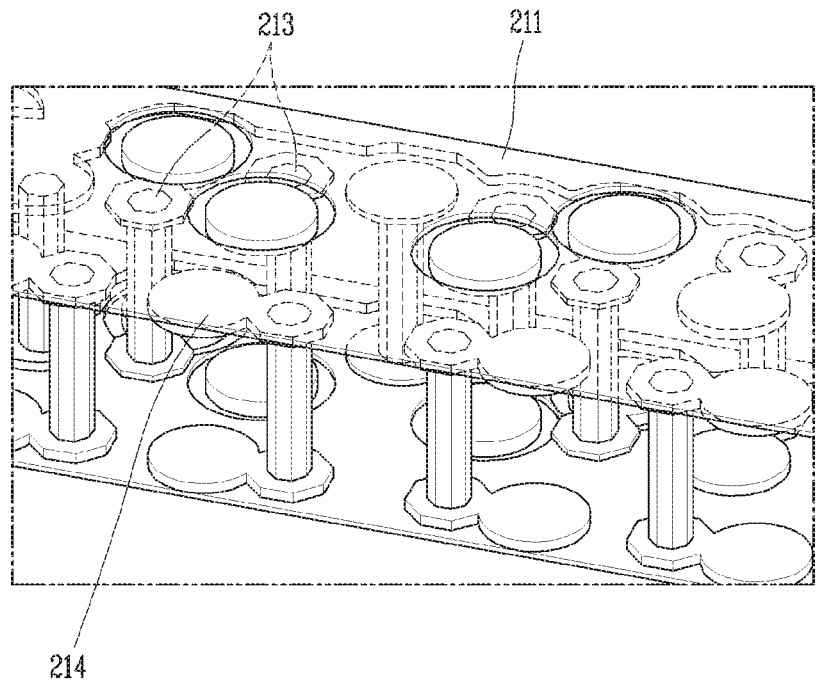
FIG. 7A is a perspective view of a PCB laminated structure showing another embodiment of the present disclosure.
Figure 7B:
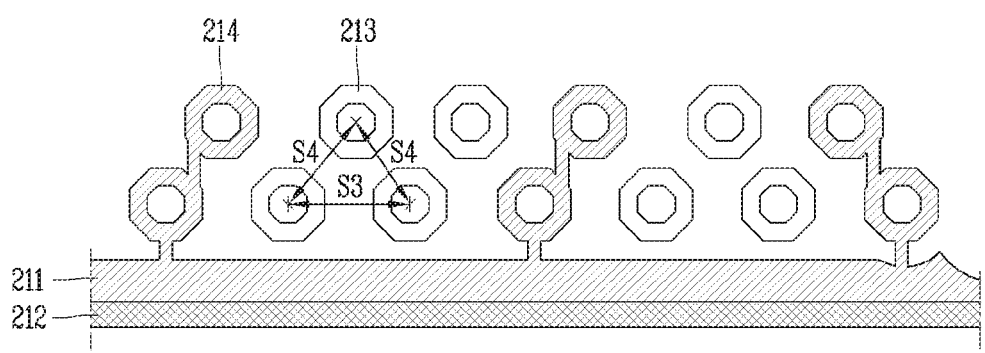
FIG. 7B is a view showing the arrangement relationship of a signal via and a ground via located in the interposer assembly.

FIG. 7A is a perspective view of the PCB laminated structure 200 showing another embodiment of the present disclosure, and FIG. 7B is a view showing a modified shape of the arrangement relationship of the signal via 213 and the ground via 214 located in the interposer assembly 210.

As shown in the drawing, a central portion of the signal via hole 213a may overlap with a central portion of the pad portion of the signal via 213. At this time, a plurality of the signal vias 213 and the ground vias 214 may be formed, and each signal via 213 and each ground via 214 may be configured to be alternately arranged at regular intervals. Furthermore, as described above, the metal coating layer 212 may be formed on the side wall 211b of the housing 211 to prevent RF signals from being distorted.

Figure 8:
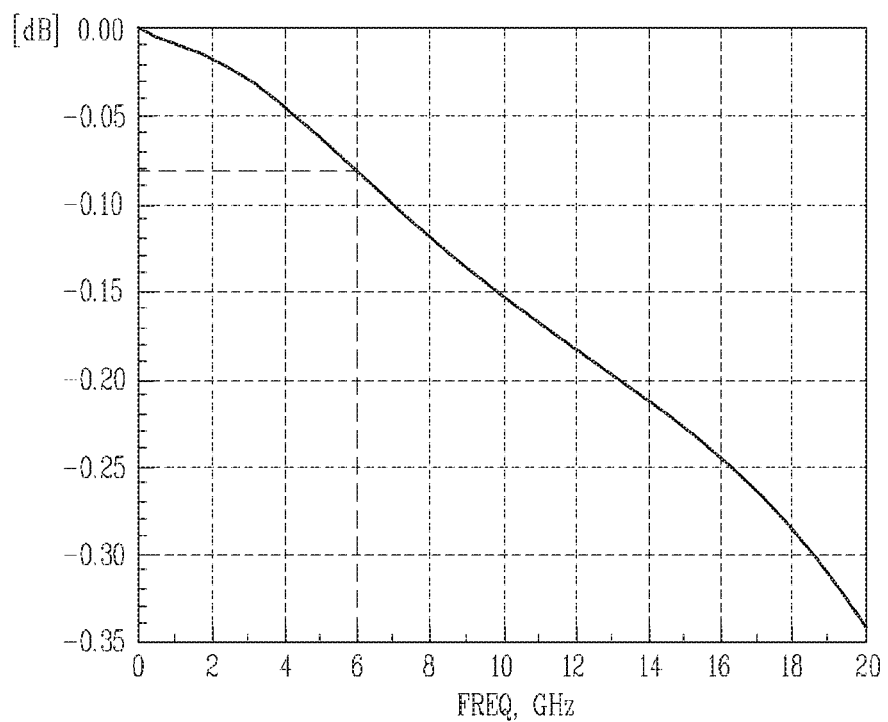
FIG. 8 is a conceptual view showing the frequency response characteristics of a PCB laminated structure according to the present disclosure.

The interposer assembly 210 of the PCB laminated structure 200 according to the present embodiment may be configured such that a central portion of the signal via hole 213a overlaps with the center of the pad portion of the signal via 213, and a plurality of signal vias 213 are disposed between the ground vias 214. In addition, the signal vias 213 may be arranged in two rows as shown in FIG. 7B, and the signal vias 213 arranged in different columns may be alternately located with each other. At this time, a distance (S3) between the signal via holes 213a of the adjacent signal vias 213 arranged in the same column and a distance (S4) between the signal via holes 213a of the signal vias 213 arranged in different columns may be configured to have the same distance. In this case, as shown in FIG. 8, it may be possible to have a transmission characteristic of −0.4 dB or less in a high frequency band above 6 GHz while having a response characteristic with a gentle slope, as well as to limit the occurrence of noise in wireless communication signals in a frequency band used in the 5G band. This is because the frequency band where the parasitic resonance occurs may be moved by the arrangement structure of the signal via 213 and the ground vis 214 according to the present disclosure and the metal coating layer 212 formed on the sidewall portion 211b.

The foregoing embodiments are merely exemplary and are not to be considered as limiting the present disclosure. The scope of the invention should be determined by reasonable interpretation of the appended claims and all changes that come within the equivalent scope of the invention are included in the scope of the invention.

What is claimed is:

1. A printed circuit board (PCB) laminated structure, comprising:
   a first substrate;
   a second substrate disposed to overlap with the first substrate; and
   an interposer assembly disposed between the first substrate and the second substrate and configured to allow signal communication between the first and second substrates,
   wherein the interposer assembly comprises:
   a housing configured to form a closed region between a top surface of the first substrate and a bottom surface of the second substrate;
   a signal via electrically coupling the first substrate and the second substrate and configured to transmit signals between the first substrate and the second substrate; and
   a ground via electrically coupled to the housing and configured to serve as a ground, wherein the ground via is positioned apart from the signal via by a predetermined distance, and
   a metal coating layer disposed at side surfaces of the housing and configured to shield signals,
   wherein a sidewall portion forms an outer surface of the interposer assembly, and
   wherein the metal coating layer is formed on an outer side surface of the sidewall portion and an inner side surface of the sidewall portion.

2. The PCB laminated structure of claim 1, further comprising a plurality of signal vias and a plurality of ground vias which are arranged at predetermined intervals along a circumference of the closed region.

3. The PCB laminated structure of claim 1, wherein the metal coating layer is selectively disposed along the side surface of the housing to be adjacent to signal emission devices mounted on the first and second substrates such that portions of the side surface of the housing are exposed between gaps of the selectively disposed metal coating layer.

4. The PCB laminated structure of claim 2, wherein two or more signal vias are consecutively arranged with ground vias on both sides of the two or more signal vias.

5. The PCB laminated structure of claim 2, wherein signal vias are arranged on both sides of each ground via.

6. The PCB laminated structure of claim 1, wherein the signal via comprises:
   a signal via hole configured to transmit signals therethrough; and
   a signal via pad portion coupled to portions surrounding both ends of the signal via hole.

7. The PCB laminated structure of claim 6, wherein a central portion of the signal via hole overlaps with a center of the signal via pad portion.

8. The PCB laminated structure of claim 1, wherein the ground via comprises ground via pad portions at both ends of the ground via and configured to contact the housing.

9. The PCB laminated structure of claim 1, wherein the housing comprises:
   support portions coupled to the top surface of the first substrate and the bottom surface of the second substrate; and
   one or more sidewall portions connecting the support portions.

10. The PCB laminated structure of claim 2, wherein the ground vias adjacent to the metal coating layer are spaced apart such that a distance between the centers of each ground via is 0.6 mm or less.

11. The PCB laminated structure of claim 5, wherein groupings of two consecutive signal vias are arranged with a ground via interposed between each grouping, and wherein each grouping of signal vias is configured to have a phase difference of 180 degrees between electromagnetic signals transmitted by each signal via of the grouping.

* * * * *